US012664341B1

(12) United States Patent
Rabinovitch et al.

(10) Patent No.: US 12,664,341 B1
(45) Date of Patent: Jun. 23, 2026

(54) PERFORMANCE AND THROUGHPUT WHEN MODELING HALF CYCLE PATHS DURING EMULATION OR PROTOTYPING

(71) Applicant: Synopsys, Inc., Sunnyvale, CA (US)

(72) Inventors: Alexander Rabinovitch, Shrewsbury, MA (US); Cedric Jean Alquier, Wissous (FR); Prashant Saxena, Portland, OR (US); Sivaprasad Acharaya, Singapore (SG)

(73) Assignee: Synopsys, Inc., Sunnyvale, CA (US)

( * ) Notice: Subject to any disclaimer, the term of this patent is extended or adjusted under 35 U.S.C. 154(b) by 771 days.

(21) Appl. No.: 18/087,124

(22) Filed: Dec. 22, 2022

(51) Int. Cl.
*G06F 30/3308* (2020.01)
*G06F 30/323* (2020.01)

(52) U.S. Cl.
CPC ........ *G06F 30/3308* (2020.01); *G06F 30/323* (2020.01)

(58) Field of Classification Search
CPC ........................... G06F 30/3308; G06F 30/323
USPC ........................................................ 716/103
See application file for complete search history.

(56) References Cited

U.S. PATENT DOCUMENTS

| | | | | |
|---|---|---|---|---|
| 8,104,012 | B1 * | 1/2012 | Klein .................... | G06F 30/327 |
| | | | | 716/132 |
| 9,244,795 | B2 * | 1/2016 | Rabinovitch ......... | G06F 11/261 |
| 9,317,639 | B1 * | 4/2016 | Jain ......................... | G06F 30/32 |
| 10,949,588 | B1 | 3/2021 | Salz et al. | |
| 11,023,635 | B1 | 6/2021 | Coudert | |
| 12,531,547 | B2 * | 1/2026 | Tang ..................... | H03K 3/0233 |
| 2003/0225559 | A1 * | 12/2003 | Sharma .................. | G06F 30/33 |
| | | | | 703/16 |
| 2007/0013424 | A1 * | 1/2007 | Padaparambil .. | H03K 3/356139 |
| | | | | 327/199 |
| 2009/0138837 | A1 * | 5/2009 | Baumgartner ...... | G06F 30/3323 |
| | | | | 716/113 |
| 2016/0314239 | A1 * | 10/2016 | Rabinovitch ........... | G06F 30/33 |
| 2017/0109466 | A1 * | 4/2017 | Guerin .................. | G06F 30/331 |
| 2020/0097625 | A1 * | 3/2020 | Rabinovitch ............. | G06F 1/08 |
| 2023/0420024 | A1 * | 12/2023 | Riley ................. | G11C 11/4074 |
| 2025/0192755 | A1 * | 6/2025 | Tang ..................... | H03K 3/037 |
| 2025/0209244 | A1 * | 6/2025 | Elmufdi ................ | G06F 30/331 |

* cited by examiner

*Primary Examiner* — Suchin Parihar
(74) *Attorney, Agent, or Firm* — Weaver Austin Villeneuve & Sampson LLP

(57) ABSTRACT

A method of verifying a logic circuit design by a hardware emulation system, includes, in part, receiving a netlist of the logic circuit design configured to operate in response to positive edges of a first clock signal, and transforming each of a first multitude of flip-flops disposed in the logic circuit design to a dual-enable flip-flop configured to operate in response to positive edges of a second clock signal thereby to generate a transformed logic circuit design. The state of the logic circuit design after 2k cycles of the first clock is the same as a state of the transformed logic circuit design after k cycles of the second clock.

20 Claims, 13 Drawing Sheets

500

PERFORMANCE AND THROUGHPUT WHEN MODELING HALF CYCLE PATHS DURING EMULATION OR PROTOTYPING

TECHNICAL FIELD

The present application relates to hardware emulation of a logic circuit, and more particularly to a hardware emulation system that improves performance and throughput when modeling half cycle paths during emulation or prototyping.

BACKGROUND

The complexity and gate count of current logic circuits has given rise to an increasing use of hardware emulation systems in verifying the functionality of the logic circuits. The netlist of a logic circuit is compiled and mapped into a multitude of programmable gate arrays disposed in the hardware emulation system prior to the verification.

SUMMARY

A method of verifying a logic circuit design by a hardware emulation system, in accordance with one embodiment of the present disclosure, includes, in part, receiving a netlist of the logic circuit design configured to operate in response to positive edges of a first clock signal; transforming each of a first multitude of flip-flops disposed in the logic circuit design to a dual-enable flip-flop configured to operate in response to positive edges of a second clock signal thereby to generate a transformed logic circuit design. A positive enable signal, a positive data input signal, and a positive data output signal of the dual-enable flip-flop respectively have similar values as an enable signal, data input signal and data output signal of the flip-flop during even cycles of the first clock. A negative enable signal, a negative data input signal, and a negative data output signal of the dual-enable flip-flop respectively have similar values as the enable signal, the data input signal and the data output signal of the flip-flop during odd cycles of the first clock. The state of the logic circuit design after 2k cycles of the first clock is the same as a state of the transformed logic circuit design after k cycles of the second clock.

In one embodiment, the method further includes, in part, performing emulation of the transformed logic circuit design. In one embodiment, the method further includes, in part generating a design clock signal from the first clock signal. The edges of the design clock signal change in response to positive edges of the first clock signal. The design clock is the fastest clock used in the logic circuit design.

In one embodiment, the method further includes, in part, transforming each of a second multitude of flip-flips in the logic circuit design that is responsive to negative edges of the design clock into a first flip-flop and a first multiplexer, wherein the first flip-flop receives positive edges of the first clock and includes an enable terminal that is coupled to a select terminal of the first multiplexer, wherein a data input terminal of the first flip-flip is coupled to a first input terminal of the first multiplexer, and wherein a data output terminal of the first flip-flop is coupled to a second input terminal of the first multiplexer.

In one embodiment, each dual-enable flip-flop includes, in part, a flip-flop, a first multiplexer and a second multiplexer. A negative data input signal of the dual-enable flip-flop is applied to a first input terminal of the first multiplexer, a negative enable terminal of the dual-enable flip-flop is applied to a select terminal of the first multiplexer, and an output of the first multiplexer is applied to a data input terminal of the flip-flop. A positive data input signal of the dual-enable flip-flop is applied to a first input terminal of the second multiplexer, and a positive enable terminal of the dual-enable flip-flop is applied to a select terminal of the second multiplexer. An output of the second multiplexer supplies the positive output signal of the dual-enable flip-flop, and an output of the flip-flop supplies the negative output signal of the dual-enable flip-flop.

In one embodiment, a positive data output signal of a first one of the multitude of dual-enable flip-flops is received as a negative data signal by a second one of the multitude of dual-enable flip-flops, and a negative data output signal of the first one of the multitude of dual-enable flip-flops is received as a positive data signal by the second one of the multitude of dual-enable flip-flops.

In one embodiment, a positive data output signal of a third one of the multitude of dual-enable flip-flops is received as positive enable signals of the first and second ones of the multitude of dual flip-flops, and a negative data output signal of the third one of the multitude of dual-enable flip-flops is received as negative enable signals of the first and second ones of the multitude of dual flip-flops.

In one embodiment, the method further includes, in part, pausing the emulation in response to a request to make a function call triggered by the design clock; computing a first function, responsive to a positive edge of the design clock, by a computer system that is in communication with the hardware emulation system; computing a second function, responsive to a negative edge of the design clock, by the computer system while the emulation remains paused; and resuming the emulation after results of the first and second functions are computed and returned to the hardware emulation system.

In one embodiment, the method further includes, in part, replicating a first combinatorial gate disposed between an output of a first one of the multitude of dual-enable flip-flops and inputs of a second one of the multitude of dual-enable flip-flops and a third one of the multitude of dual-enable flip-flops if the first one of the multitude of dual-enable flip-flops has a non-zero negative enable signal. The second one of the multitude of dual-enable flip-flops has a non-zero negative enable signal during negative cycles of the design clock, and the third one of the multitude of dual-enable flip-flops has a non-zero positive enable signal during positive cycles of the design clock.

In one embodiment, the method further includes, in part, identifying, from among a multitude of clock signals derived from the design clock, at least a first clock signal having a frequency that is smaller than a frequency of the design clock; and shifting times of changes of the first clock such that each time shifted change occurs at substantially a same time as a nearest upcoming rising of edge of the design clock.

A hardware emulation system, in accordance with one embodiment of the present disclosure, includes, in part, a memory storing instructions; and a processor, coupled with the memory and configured to execute the instructions. The instructions when executed cause the processor to receive a netlist of the logic circuit design configured to operate in response to positive edges of a first clock signal; and transform each of a first multitude of flip-flops disposed in the logic circuit design to a dual-enable flip-flop configured to operate in response to positive edges of a second clock signal thereby to generate a transformed logic circuit design. A positive enable signal, a positive data input signal, and a positive data output signal of the dual-enable flip-flop respectively have similar values as an enable signal, data input signal and data output signal of the flip-flop during even cycles of the first clock. A negative enable signal, a negative data input signal, and a negative data output signal of the dual-enable flip-flop respectively have similar values as the enable signal, the data input signal and the data output signal of the flip-flop during odd cycles of the first clock. The state of the logic circuit design after 2k cycles of the first clock is a same as a state of the transformed logic circuit design after k cycles of the second clock.

In one embodiment, the instructions further cause the processor to perform emulation of the transformed logic circuit design, wherein a state of the logic circuit design after 2k cycles of the first clock is the same as a state of the transformed logic circuit design after k cycles of the second clock. In one embodiment, the instructions further cause the processor to generate a design clock signal from the first clock signal, wherein edges of the design clock signal change in response to positive edges of the first clock signal, and wherein the design clock is the fastest clock used in the logic circuit design.

In one embodiment, the instructions further cause the processor to transform each of a second multitude of flip-flip in the logic circuit design that is responsive to negative edges of the design clock into a first flip-flop and a first multiplexer, wherein the first flip-flop receives positive edges of the first clock and includes an enable terminal that is coupled to a select terminal of the first multiplexer, wherein a data input terminal of the first flip-flip is coupled to a first input terminal of the first multiplexer, and wherein a data output terminal of the first flip-flop is coupled to a second input terminal of the first multiplexer.

In one embodiment, each dual-enable flip-flop includes, in part, a flip-flop, a first multiplexer and a second multiplexer. A negative data input signal of the dual-enable flip-flop is applied to a first input terminal of the first multiplexer, a negative enable terminal of the dual-enable flip-flop is applied to a select terminal of the first multiplexer, and an output of the first multiplexer is applied to a data input terminal of the flip-flop. A positive data input signal of the dual-enable flip-flop is applied to a first input terminal of the second multiplexer, and a positive enable terminal of the dual-enable flip-flop is applied to a select terminal of the second multiplexer. An output of the second multiplexer supplies the positive output signal of the dual-enable flip-flop, and an output of the flip-flop supplies the negative output signal of the dual-enable flip-flop.

In one embodiment, a positive data output signal of a first one of the multitude of dual-enable flip-flops is received as a negative data signal by a second one of the multitude of dual-enable flip-flops, and a negative data output signal of the first one of the multitude of dual-enable flip-flops is received as a positive data signal by the second one of the multitude of dual-enable flip-flops.

In one embodiment, the instructions further cause the processor to pause the emulation in response to a request to make a function call triggered by the design clock; compute a first function, responsive to a positive edge of the design clock, by a computer system that is in communications with the hardware emulation system; compute a second function, responsive to a negative edge of the design clock, by the computer system while the emulation remains paused; and resume the emulation after results of the first and second functions are computed and returned to the hardware emulation system.

In one embodiment, the instructions further cause the processor to replicate a first combinatorial gate disposed between an output of a first one of the multitude of dual-enable flip-flops and inputs of a second one of the multitude of dual-enable flip-flops and a third one of the multitude of dual-enable flip-flops if the first one of the multitude of dual-enable flip-flops has a non-zero negative enable signal, the second one of the plurality of dual-enable flip-flops has a non-zero negative enable signal during negative cycles of the design clock, and the third one of the multitude of dual-enable flip-flops has a non-zero positive enable signal during positive cycles of the design clock.

In one embodiment, the instructions further cause the processor to identify, from among a multitude of clock signals derived from the design clock, at least a first clock signal having a frequency that is at least twice smaller than a frequency of the design clock; and shift times of changes of the first clock such that each time shifted change occurs at substantially a same time as a nearest upcoming rising of edge of the design clock.

A non-transitory computer readable medium comprising stored instructions, which when executed by a processor, cause the processor to receive a netlist of the logic circuit design configured to operate in response to positive edges of a first clock signal; and transform each of a first multitude of flip-flops disposed in the logic circuit design to a dual-enable flip-flop configured to operate in response to positive edges of a second clock signal thereby to generate a transformed logic circuit design. A positive enable signal, a positive data input signal, and a positive data output signal of the dual-enable flip-flop respectively have similar values as an enable signal, data input signal and data output signal of the flip-flop during even cycles of the first clock. A negative enable signal, a negative data input signal, and a negative data output signal of the dual-enable flip-flop respectively have similar values as the enable signal, the data input signal and the data output signal of the flip-flop during odd cycles of the first clock. The state of the logic circuit design after 2k cycles of the first clock is a same as a state of the transformed logic circuit design after k cycles of the second clock.

DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1B:
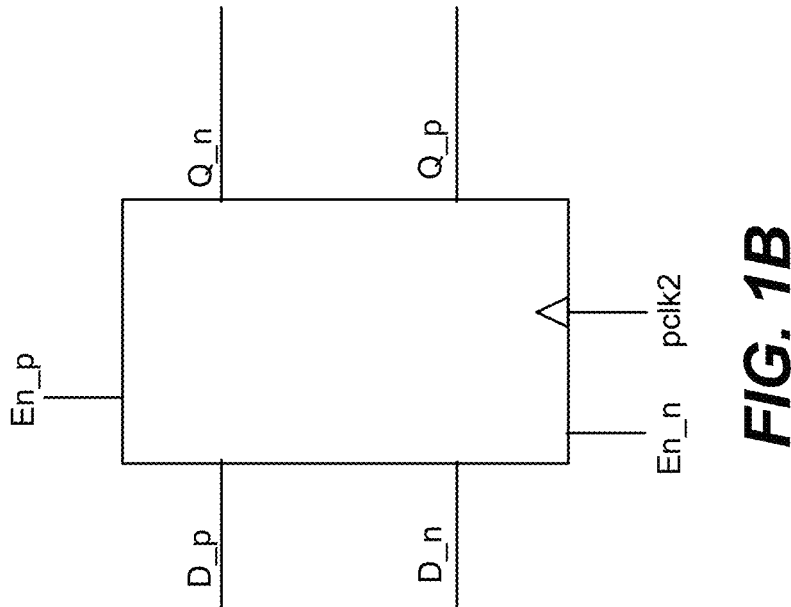
FIG. 1B shows a dual-enable flip-flop, in accordance with one embodiment of the present disclosure.

Aspects of the present disclosure relate to improving performance and throughput when modeling half cycle paths during emulation or prototyping.

One metric in determining the performance of a hardware emulation system is its throughput. The higher the throughput of a hardware emulation system, the shorter the emulation time, and thus the lower is the cost of the emulation. In an emulation system, the period of a design clock, which is the fastest clock used in the design, is defined by a delay value that is twice the delay associated with the largest of either (i) the longest path starting at a positive edge of the design clock and ending at the negative edge of the design clock, or (ii) the longest path starting at a negative edge of the design clock and ending at the positive edge of the design clock. For example, if the longest path starting at a positive edge of the design clock has a delay of 40 nanoseconds (ns), and the longest path starting at a negative edge of the design clock has a delay of 10 ns, the design clock has a period of 80 ns (=2×40 ns).

In accordance with one embodiment of the present disclosure, the period of a design clock is defined by a delay value that is a sum of the longest path starting at a positive edge of the design clock, and the longest path starting at a negative edge of the design clock. For example, if the longest path starting at a positive edge of the design clock has a delay of 40 ns, and the longest path starting at a negative edge of the design clock has a delay of 10 ns, the period of the design clock is 50 ns. A hardware emulation system and method, in accordance with embodiments of the present disclosure, therefore, advantageously has an enhanced throughput, and reduces the emulation time and hence the emulation cost.

The timing of events in a logic circuit undergoing emulation is often synchronized with respect to changes of a clock. Such a clock may be a clock defined by a user (referred to hereinafter alternatively as the design clock) with respect to positive, negative or both edges of which one or more groups of the sequential logic elements disposed in the logic circuit operate. A logic design may also include other clocks that are derived from the design clock, are slower than the design clock, and are applied to other groups of sequential logic elements disposed in the logic circuit.

Verilog code (1) below defines a flip-flip with an enable terminal En, a data input terminal D, and a data output terminal Q:

always @(posedge *pclk*1)

if (*En*)D<=Q                    (1)

In accordance with code (1), during each positive edge (posedge) of clock signal pclk1, if the enable terminal En is asserted (e.g., is at a logic 1), then the value of data D is transferred to and stored at the output terminal Q.

The positive edges of clock signal pelk1 that occur during cycles 0, 2, 4 . . . 2k of the hardware emulation are referred to herein as even cycles, and the positive edges of clock signal pclk1 that occur during cycles 1, 3, 5 . . . 2k−1 of the hardware emulation are referred to herein as odd cycles, where k refers to a positive integer.

Verilog code (2) below defines a dual-enable flip-flip to which a flip-flop of an original design may be transformed. The dual-enable flip-flop defined by Verilog code (2) operates in response to positive edges of clock signal pclk2 and includes a positive enable terminal En_p, a negative enable terminal En_n, a positive data input terminal D_p, a negative data input terminal D_n, a positive data output terminal Q_p, and a negative data output terminal Q_n.

always @(posedge *pclk*2) begin if (*En_p*)

Q_p<=D_p;

else if (*En_n*)

Q_p<=D_n;

end assign Q_n=En_n?D_n:Q_p              (2)

The "if-else if" statement, on the rising edge of clock signal pclk2, causes Q_p to be set to D_p if En_p is asserted and to D_n if En_n is asserted. The "assign" statement causes Q_n to be set to D_n if En_n is asserted; otherwise, the assign statement causes Q_n to be set to Q_p.

Figure 1A:
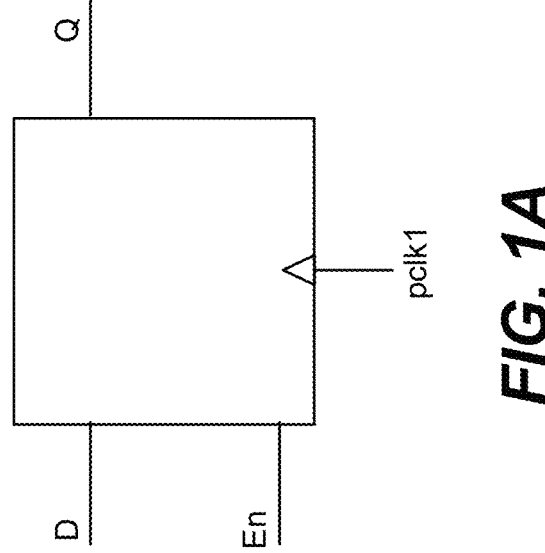
FIG. 1A shows a flip-flop (flop).

FIG. 1A is a schematic diagram of a flip-flop 12 that operates on rising edges of clock signal pclk1, as defined by Verilog code (1). FIG. 1B is a schematic diagram of a flip-flop 14 defined by Verilog code (2). As described above and further below, in accordance with one aspect of the present disclosure, a flip-flop may be transformed to a dual-enable flip-flop 14 by the compiler of a hardware emulation system if the compiler does not identify the flip-flop as being a positive clock edge flip-flop or a negative clock edge flip-flop.

A dual-enable flop is defined herein as having a pair of data input terminals D_p, D_n, a pair of enable terminals En_p, En_n, a pair of output terminals Q_p, Q_n, and a clock signal pclk2. Terminal D_p receives the data that is evaluated by the dual-enable flop in even cycles. Terminal D_n receives the data that is evaluated by the dual-enable flop in odd cycles. Terminal En_p receives an enabling signal during the even cycles. Terminal En_n receives an enabling signal during the odd cycles. Terminal Q_p supplies the output value of the dual-enable flop during the even cycles. Terminal Q_n supplies the output value of the dual-enable flop during the odd cycles. The term "terminal" may alternatively be used herein to refer to the signal carried by the terminal. For example, terminal D_p may alternatively be referred to as signal D_p and vice versa. In accordance with one aspect of the present disclosure, and as described further below, the value of En_p of transformed flop 14 computed during cycle K of clock pclk2 is the same as the value of En of the original flop 12 during cycle 2K+2 of clock pclk1. Similarly, the value of En_n of transformed flop 14 computed during cycle K of clock pclk2 is the same as the value of En of the original flop 12 during cycle 2K+1 of pclk1. For example, during cycle 0 of clock pclk2, enabling signal En_p of flop 14 is computed to have the same value as the enabling signal En of flop 12 in cycle 2 of clock pclk1. Similarly, for example, during cycle 0 of clock pclk2, enabling signal En_n of flop 14 is computed to have the same value as the enabling signal En of flop 12 in cycle 1 of clock pclk1.

Output signal Q_p is set to D_p in response to a positive edge of pclk2 if En_p is asserted. Similarly, output signal Q_n is set to D_n in response to a positive edge of pclk2 if En_n is asserted. Signal En_p is asserted if and only if the dual-enable flop is about to be evaluated in the next even cycle. Signal En_n is asserted if and only if the dual-enable flop is about to be evaluated in the next odd cycle.

The values of signals En_p and D_p of dual-enable flip-flop 14 are the same as the values of En and D of flip-flop 12 during even cycles. Similarly, the values of signals En_n and D_n of dual-enable flip-flop 14 are the same as the values of En and D of flip-flop 12 during odd cycles. Output signal Q_p of dual-enable flip-flop 14 has the same value as output signal Q of flip-flop 12 during even cycles, and output signal Q_n of dual-enable flip-flop 14 has the same value as output signal Q of flip-flop 12 during odd cycles. By transforming the flip-flops disposed in an original design (alternatively referred to herein as reference design) to dual-enable flip-flops, when the compiler cannot identify the reference flip-flops as either being evaluated during even cycles only, or during odd cycles only,), the number of emulation cycles of the transformed design is reduced to one half the number of emulation cycles of the reference design. Accordingly, if the reference design requires 2k emulation cycles to complete the verification, the transformed design requires k emulation cycles to complete the verification. The state of reference design at emulation cycle 2k is equivalent to the state of the transformed design at emulation cycle k. The state of the design at any cycle is understood to refer to the values of the signals at the input and output terminals of each flip-flip and each combinational logic disposed in the design in that cycle.

In emulation, the design clock (also referred to herein as clock "C") may be derived from the driver clock "pclk1". Clock signal "pclk1" may be the fastest internal emulation clock and is shown as applied to the clock terminal of flip-flop 12 shown in FIG. 1A.

The design clock may be derived from clock signal "pclk1" according to the following Verilog code (3):

$$\text{always @(posedge } pclk1)C<=\sim C \tag{3}$$

According to Verilog code (3), during each positive edge (posedge) of clock signal pclk1, clock signal C is inverted (i.e., "–C" represents the inverse of "C"). Consequently, in the implementations represented by Verilog code (3), the frequency of clock signal pclk1 is twice the frequency of signal C.

Cycles during which a positive edge of clock C is used to evaluate a flip-flop (alternatively referred to herein as flop) in the reference design are defined herein as positive cycles. For example, the flop represented by the following Verilog code (4):

$$\text{@(posedge } C)q<=d \tag{4}$$

transfers and stores the value present at its data terminal "d" to its output terminal "q" only in response to positive edges of clock C. Therefore, the flop represented by Verilog code (4), is evaluated during positive cycles only. Similarly, cycles during which a negative edge of clock C are used to evaluate a flop in the reference design are defined herein as negative cycles. A flop may be evaluated during positive cycles only, or during negative cycles only, or during both positive and negative cycles.

In accordance with one aspect of the present disclosure, all flops of a logic circuit that are evaluated at the edges of clock "C" may undergo an initial transformation—prior to emulation—such that after the transformation, all the flops are driven with respect to the positive edges (i.e., transitions) of clock signal "pclk1". The enable and data input terminals of every flop are driven either directly by other flops or by a combinatorial logic block disposed between the flop and the other flops.

A flop may be evaluated during positive cycles and negative cycles based on the state of the flop's enable terminal "En". The following Verilog code (5) defines a flop whose clock signal ck is determined by an XOR Boolean operation of clock C and enable signal En:

$$\text{assign } ck=C\hat{}En;$$

$$\text{always @(posedge } ck)q<=d; \tag{5}$$

It is seen from Verilog code (5) that if En is at a logic 0, a positive edge of clock C results in a positive edge of clock ck. If En is at a logic 1, however, a negative edge of clock C results in a positive edge of clock ck. Therefore, a flop represented by Verilog code (5) may be evaluated in both positive and negative cycles, depending on the value of the flop's enable signal En.

In accordance with one aspect of the present disclosure, if during a compilation of a reference design netlist by a hardware emulation system, a flop in the netlist is not identified as being either a positive flop (i.e., a flop evaluated during the positive cycles), or a negative flop (i.e., a flop evaluated during the negative cycles), the flop is identified as being a dual-edge flop configured to be evaluated during both positive and negative cycles. A dual-edge flop identified in the original design netlist is then transformed to a dual-enable flop, in accordance with one aspect of the present disclosure. A dual-edge flop is understood to refer to a flop that is evaluated in response to both positive edges and negative edges of the clock.

Figure 2:
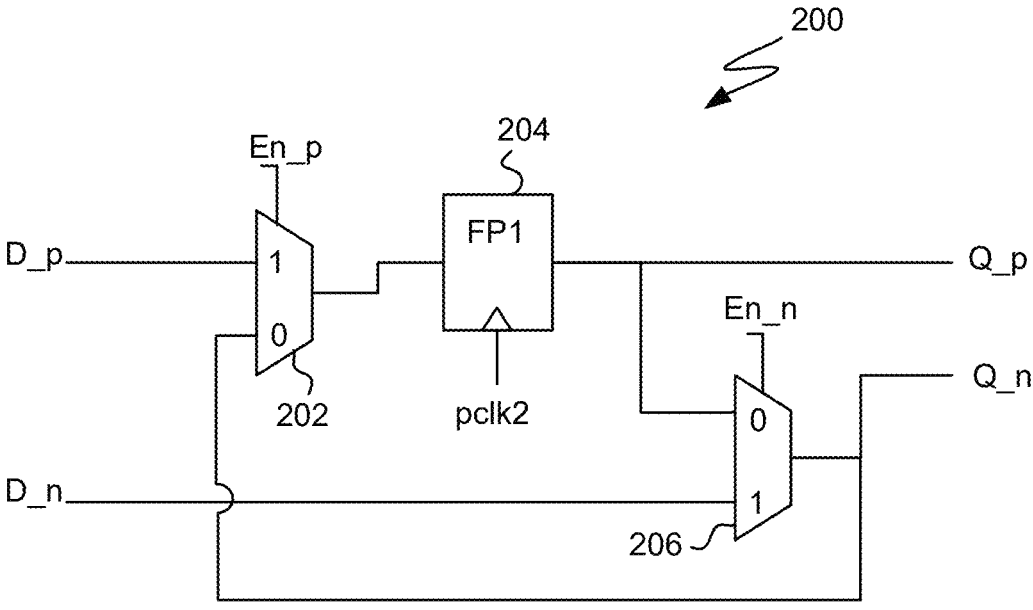
FIG. 2 shows logic components of the dual-enable flip-flop of FIG. 1B, in accordance with one embodiment of the present disclosure.

FIG. 2 is a logic schematic diagram of a dual-enable flop 200 whose block diagram is shown in FIG. 1B, in accordance with one embodiment. Dual-enable flop 200 is shown as including multiplexers 202, 206 and flop 204. In response to each positive edge of clock pclk2, if En_p is asserted (e.g., at a logic 1) and En_n is deasserted, then Q_p is set to D_p. If En_p is deasserted and En_n is asserted during a rising edge of signal pclk2, then Q_n is set to D_n.

In accordance with one embodiment of the present disclosure, if a multitude of dual-edge flops in the reference design are configured such that the output data terminal of, e.g., a first flop directly drives the input data terminal of, e.g., a second flop, then in the transformed design, the output data terminal Q_p of the first flop drives the input data terminal D_n of the second flop, and the output data terminal Q_n of the first flop drives the input data terminal D_p of the second flop.

Figure 3:
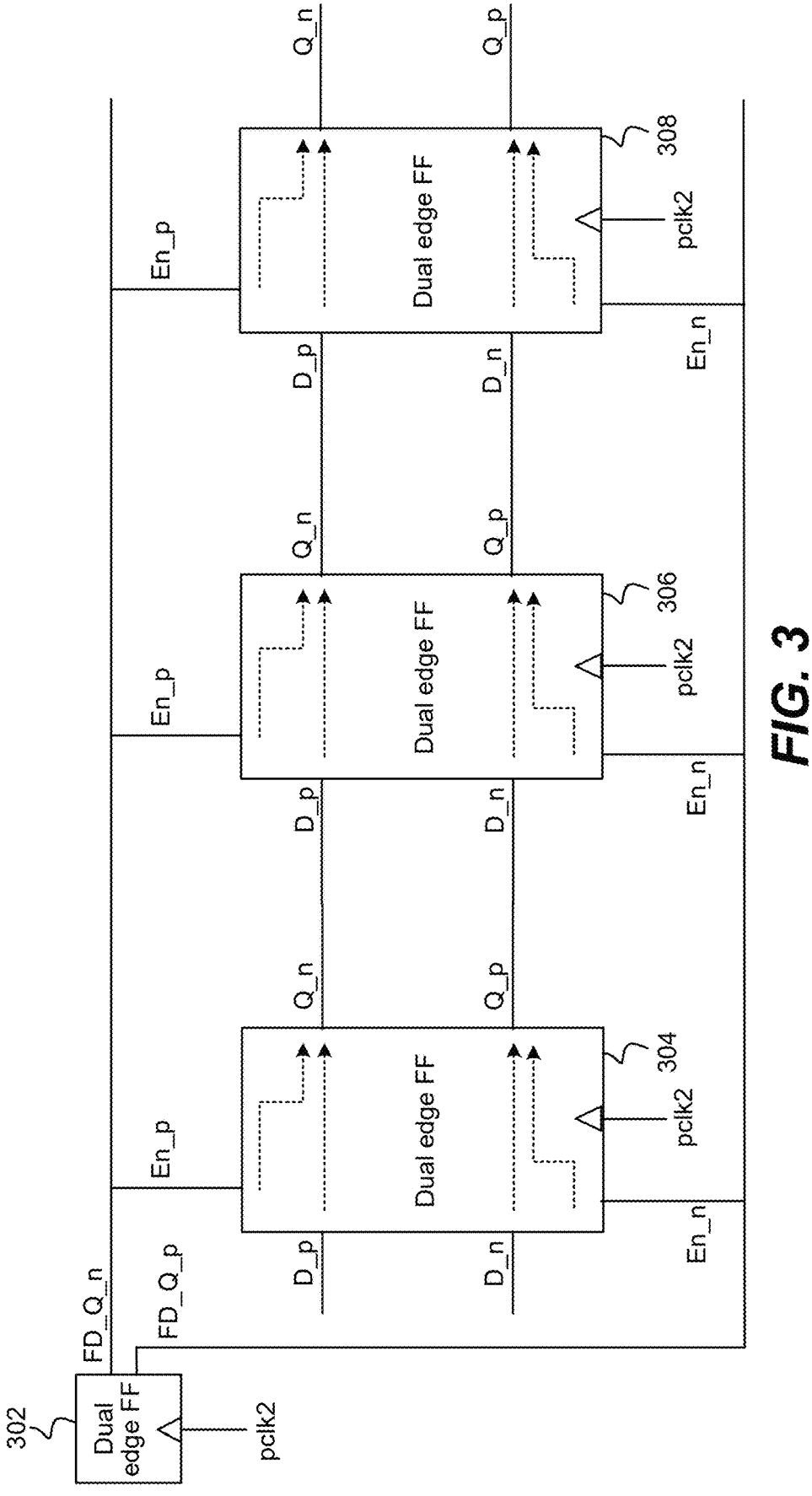
FIG. 3 shows a number of dual-enable flip-flops coupled to one another to form a chain, in accordance with one embodiment of the present disclosure.

FIG. 3 shows a number of dual-enable flops 302, 304, 306 and 308 that are coupled to one another to form a chain, in accordance with one embodiment of the present disclosure. Each of the dual-enable flops 302, 304, 306 and 308 corresponds to the dual-enable flop shown in FIGS. 1A and 2. Output terminal Q_n of flop 304 is shown as driving data input terminal D_p of flop 306, and output terminal Q_p of flop 304 is shown as driving data input terminal D_n of flop 306. Similarly, output terminal Q_n of flop 306 is shown as driving data input terminal D_p of flop 308, and output terminal Q_p of flop 306 is shown as driving data input terminal D_n of flop 308. As was described in detail above, the data present on input terminal D_p of each flop is transferred to the output terminal Q_p of the same flop in response to a positive edge of clock signal pclk2 when the enable signal En_p of the flop is asserted, and the data present on input terminal D_n of each flop is transferred to the output terminal Q_n of the flop in response to a positive edge of clock signal pclk2 when the enable signal En_n of the flop is asserted. The enable terminals En_p of flops 304, 306 and 308 is supplied by Q_n data output of flop 302, and the enable terminals En_n of flops 304, 306 and 308 is supplied by Q_p data output of flop 302 to conform with the reference design.

If a reference design netlist includes a flop that is identified as being a negative flop, the flop may undergo an initial transformation-prior to emulation-so that that flop is driven with respect to the positive edges of clock signal "pclk1", as described above. The transformed flop is then further transformed to be represented by a multiplexer and a flop that is clocked by positive edges of clock signal "pclk2", in accordance with one aspect of the present disclosure and as described further below.

Figures 4A, 4B:
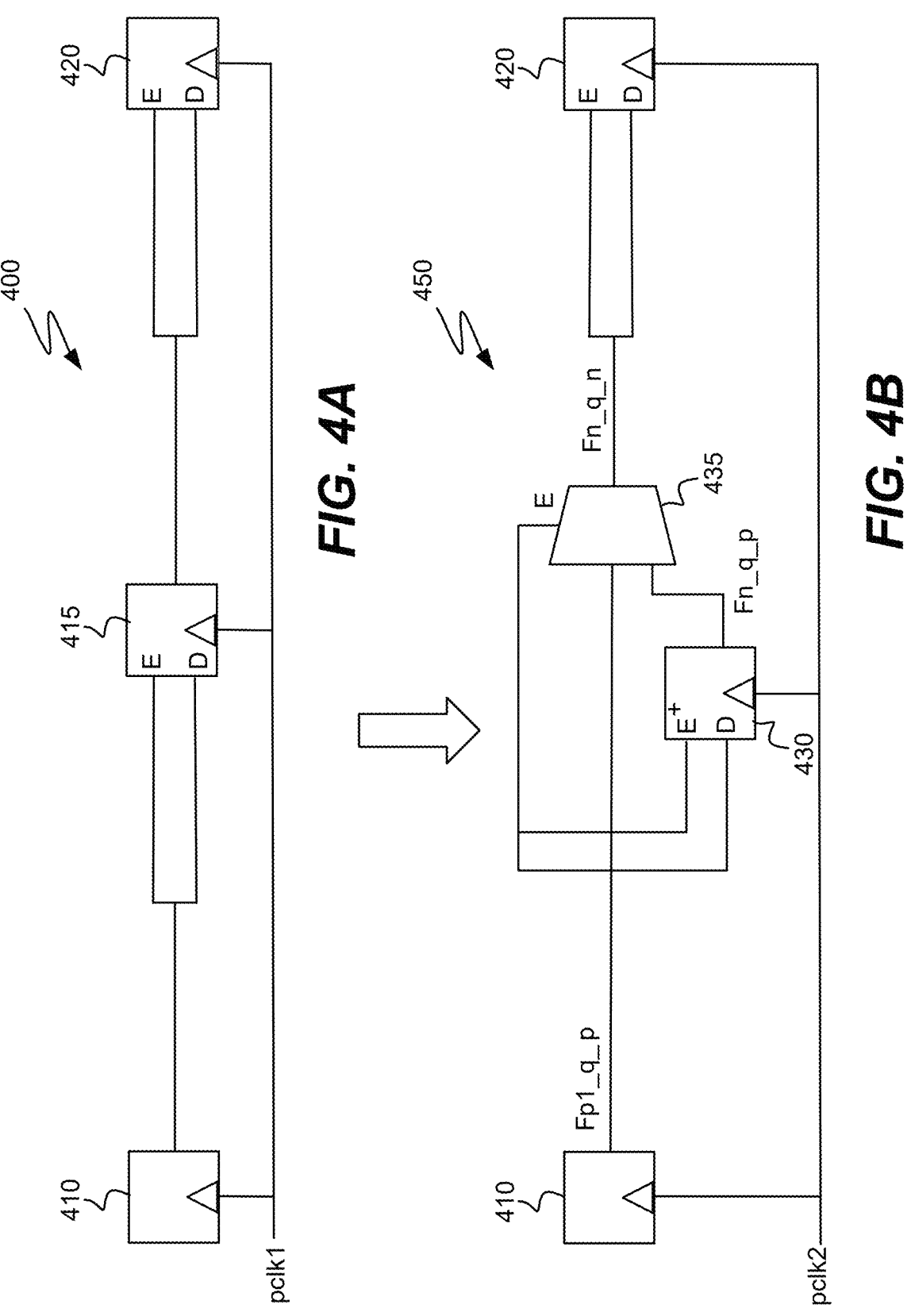
FIG. 4A is an example diagram of a logic circuit design prior to transformation for hardware emulation verification.
FIG. 4B shows the logic circuit design of FIG. 4A after a transformation, in accordance with one embodiment of the present disclosure.

FIG. 4A is an example diagram of a logic circuit design 400 prior to transformation for hardware emulation verification. Logic circuit design 400 is show as including flops 410, 415 and 420, all three of which transfer and store their respective data (i.e., are evaluated) in response to the positive edges of the driver clock "pclk1", as shown. Flops 410 and 420 are evaluated during the positive cycles. Flop 415 is evaluated during the negative cycles. Flop 415 is shown as receiving the output signal of flop 10 at its both data and enable terminals. Similarly, flop 420 is shown as receiving the output signal of flop 415 at its both data and enable terminals FIG. 4B is a logic circuit diagram 450 determined based on the transformation of logic circuit diagram 400 of FIG. 4A, in accordance with one embodiment of the present disclosure. Flops 410 and 420 that evaluate during the positive cycles remain unchanged. In accordance with one aspect of the present disclosure, flop 415 that evaluates during the negative cycles is transformed so that it is represented by flop 430 and multiplexer 435. Flops 410, 420 and 430 of the transformed logic circuit are driven by the positive edge of clock signal "pclk2", as shown.

If the enable terminals of flops 415 and 420 are set to 1 by their respective predecessor flops 410 and 415 in the reference circuit 400 of FIG. 2A, it is seen that the data present at the data input terminal of flop 410 is transferred to output terminal of flop 420 after three cycles of clock pclk1. In the transformed circuit 450 of FIG. 2B, however, after the first cycle of clock pclk2 when the enable signal E settles to 1, the output of flop 410 becomes available at the output of multiplexer 435 as well as at the input of flop 420. Therefore, the data from flop 410 is received and evaluated by flop 420 after two clock cycles. During clock cycle 2, flop 430 of the transformed circuit is evaluated in the same manner as flop 415 of the reference circuit. If in the reference circuit design 400, the enable signal (E) is set to 0 after the first cycle, then flop 415 is not evaluated. In the same manner, if the output of flop 410 which supplies the enable signal E to flop 430 settles to 0 after the first cycle, flop 430 is disabled and thus is prevented from passing the data from flop 410 to flop 420. In other words, the value of flop 415 of the reference circuit in cycle 2k−1 is the same as the value of flop 430 of the transformed circuit in cycle k, and the value of flop 420 of the reference circuit in cycle 2k is the same as the value of flop 420 of the transformed circuit in cycle k+1. Therefore, because in accordance with embodiments of the present disclosure, the evaluation of the flops during the negative cycles is eliminated, the emulation throughout is increased by a factor of 2.

Figure 5A:
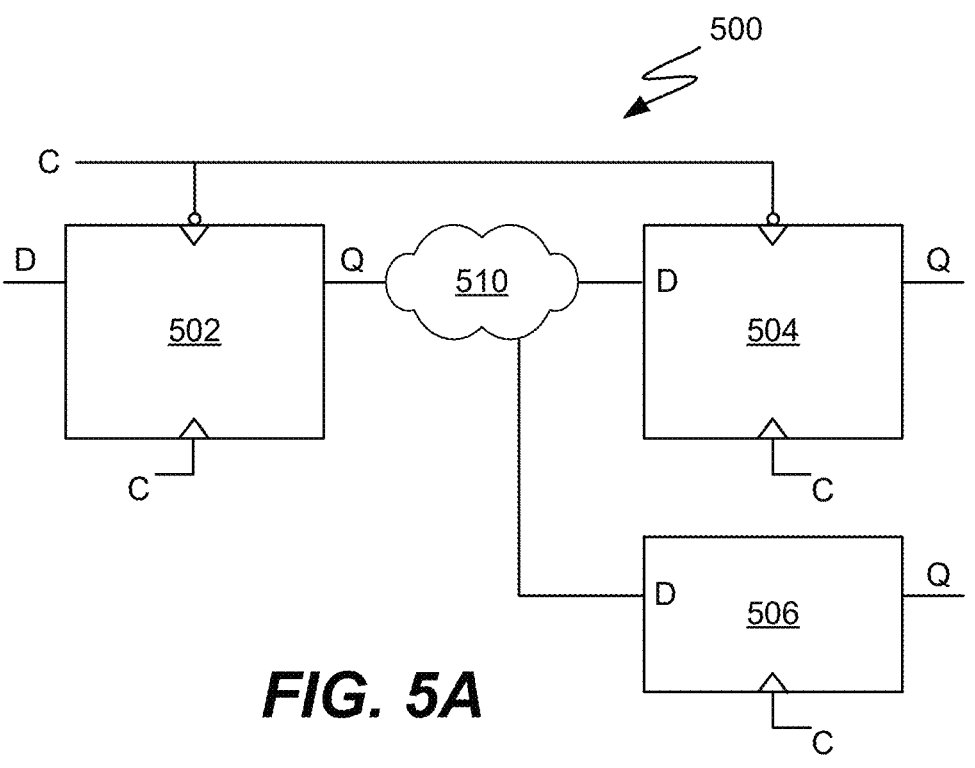
FIG. 5A shows an example of a logic circuit that includes a multitude of flip-flips and a combinatorial logic disposed therebetween.
Figure 5B:
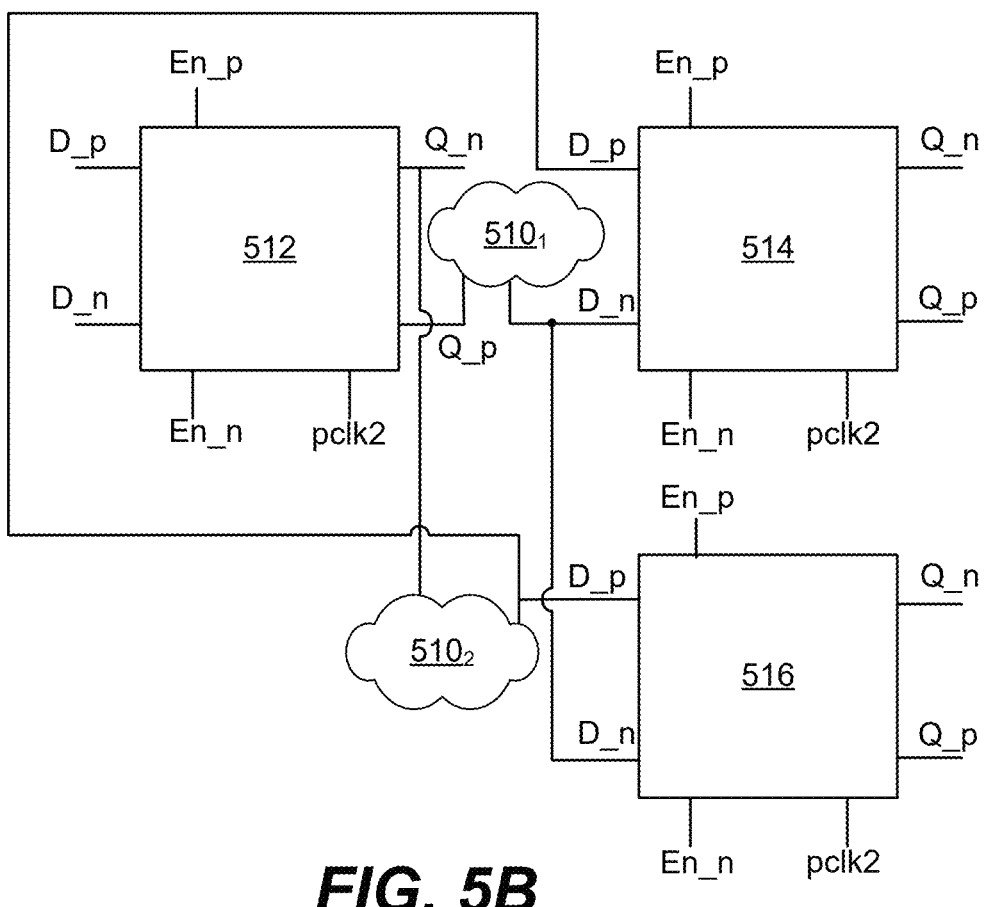
FIG. 5B shows the logic circuit of FIG. 5A after a transformation, in accordance with embodiment of the present disclosure.

FIG. 5A shows an example of a reference logic circuit 500. Logic circuit 500 is shown as including a combinatorial logic block 510 disposed between flops 502, 504 and 506 each of which is determined by the compiler of the hardware emulation system as a dual-edge flop. FIG. 5B shows the same circuit 500 after flops 502, 504 and 506 are transformed to dual-enable flops 512, 514 and 516 respectively, in accordance with embodiment of the present disclosure. Because logic block 510 is disposed between the negative and positive input and output terminals of flops 512, 514 and 516, two instantiations of logic block 510 may be required to provide the required functionality, in accordance with the conditions described below.

If the negative enable terminal En_n of flop 512 which supplies an output signal to logic block 510 (i.e., flop 512 is a source flop to logic block 510) is non-zero, and (i) flop 514 which receives the output of logic block 510 (i.e., flop 514 is a sink flop to logic block 410) has a non-zero negative enable terminal En_n or a non-zero D_n terminal for evaluation in a negative cycle, and (ii) flop 514 has a non-zero positive enable terminal En_p or a non-zero D_p terminal for evaluation in a positive cycle, then two instantiations of block 510 are required and created. The two instantiations are shown as $510_1$ and $510_2$. Instantiation $510_1$ receives data from terminal Q_p of flop 512 and supplies output data to terminals D_n of flops 514 and 516. Instantiation $510_2$ receives data from terminal Q_n of flop 512 and supplies output data to terminals D_p of flop 516 and 514. It is understood that in some embodiments, flops 514 and 516 may be the same flop.

When verifying a design in a hardware emulation system, there may be a need to temporarily stop the emulation, transfer data from the emulation system to a computer system via a data link, such as Peripheral Component Interconnect Express (PCI) Express, perform a function by the computing system using for example, a C++ programming language, and return the results to the hardware emulation system. A call to an external computer to perform such functions using, for example C++, is referred to herein as direct programming interface (dpi).

Code (6) shown below is an example of a dpi call that causes the emulation to temporarily stop on a positive edge of design clock C.

$$always@(posedge\ C)a<=dpi1(\ ) \qquad (6)$$

The dpi code (5) causes the emulation to stop on the positive edge of clock C, the data from the emulation system is then transferred to the computing system that is in communication with the hardware emulation system. The computing system performs the function represented by function call "dpi1" using the transferred data, and returns the results back to the emulation system, which is subsequently assigned to variable "a" shown in code (6). The assignment of the computation result to variable "a", in turn, causes the emulation to resume. Until the computation results are returned and assigned to variable "a", the emulation system remains halted, and the next edge of clock C is not reached.

Code (7) shown below is an example of another dpi call "dpi2" that causes the emulation to temporarily stop on a negative edge of design clock C.

$$always@(negedge\ C)a<=dpi2(\ ) \qquad (7)$$

After the computing system performs the function represented by function call "dpi2" and the result of the computation of the function is assigned to variable "a", the emulation resumes.

Figure 6A:
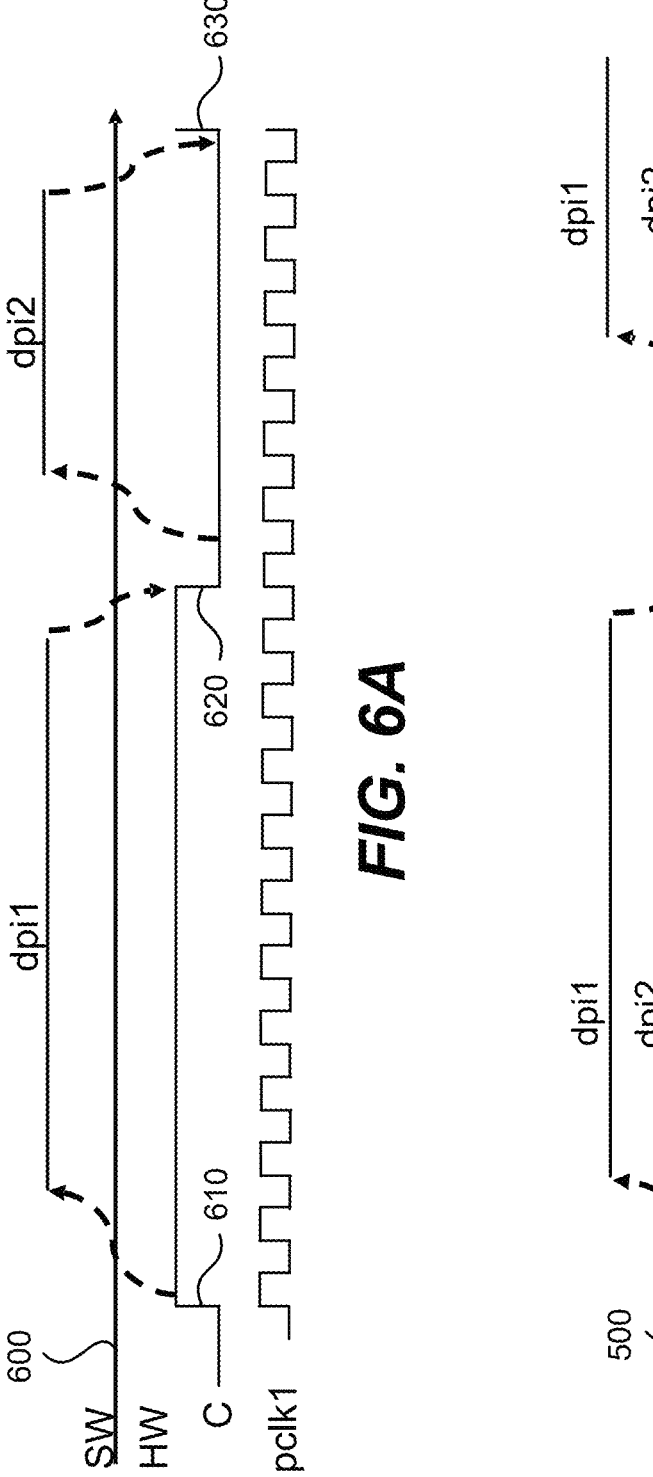
FIG. 6A shows an example of a pair of dpi calls during hardware emulation.

FIG. 6A shows the emulation driver clock pclk1 and the design clock C that occur in the hardware emulation (HW), in accordance with one example. In response to dpi1 call, on positive edge 610 of design clock C, the emulation is halted, and the data from the emulation is transferred to a computing system that performs a function (e.g., a C++ function) in software (S/W), for example, a processing device that executes operations or a set of instructions. Line 600 is shown as separating the activities performed in hardware by the hardware emulator from the activities performed in software by the computing system. In response to the positive edge 610 of design clock C, the emulation is halted and the dpi1 call functions are performed by the computing system. The design clock C does not oscillate while dpi1 function computation is in progress. The dpi1 function computation is shown as having completed and assigned to variable "a" at edge 620 of clock C. During the entire time period between edges 610 and 620 the emulation system is idle. FIG. 6A also shows that the dpi2 call is activated in response to negative edge 620 of clock C thus causing the emulation to stop again. After the result of the computation of the function associated with the dpi2 call is returned to the emulation system, clock C begins oscillation after the positive edge 630 of clock C.

Figure 6B:
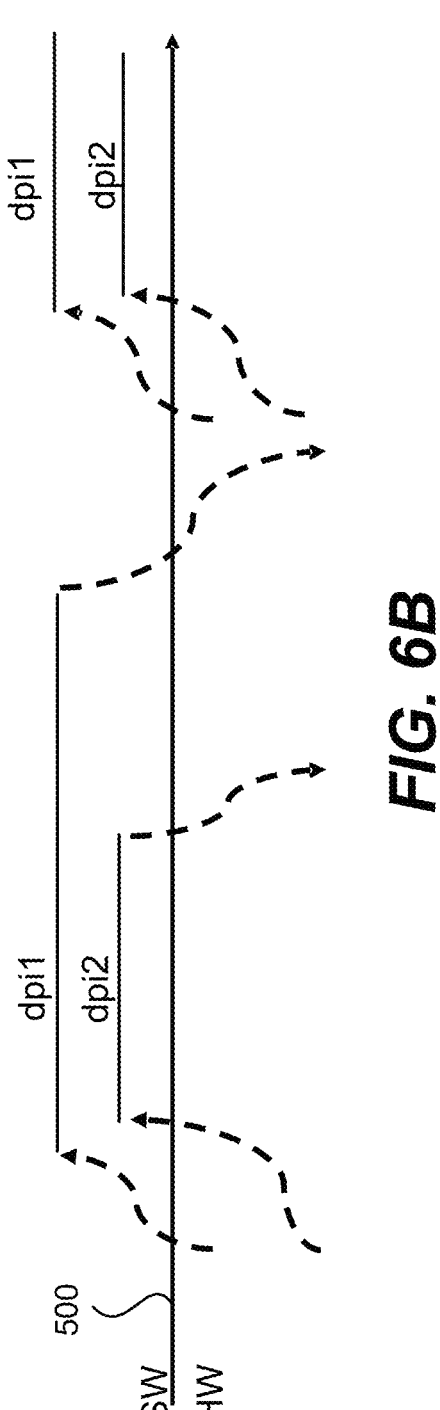
FIG. 6B shows another example of a pair of dpi calls during hardware emulation, in accordance with embodiment of the present disclosure.

In accordance with embodiments of the present invention, however, dpi call functions are carried out in parallel, thus reducing the emulation idle time. Referring to FIGS. 4A and 4B as described above, flop 415 that is responsive to the negative edges of the design clock C is transformed so that it is replaced, in part, by flop 430 which operates on positive edge of the driver clock pclk. Accordingly, while in untransformed circuit 400, three clock cycles are required to transfer input data from flop 410 to output of flop 420, in the transformed circuit 450, after only two clock cycles, input data from flop 410 is transferred to the output of flop 420. Because both positive and negative cycles of clock C may occur during the same emulation cycle of pclk2, in accordance with one embodiment of the present disclosure, both dpi1 and dpi2 call functions may be evaluated in parallel, thereby reducing the idle time and enhancing the throughput of the emulation system. FIG. 6B shows that the dpi1 call, triggered in response to a positive edge of clock C (not shown), and the dpi2 call, triggered in response to the negative edge of clock C (not shown), are performed in parallel, hence reducing the idle time and increasing the throughput of the emulation system, in accordance with embodiment of the present disclosure.

As described in detail above, each flop in a reference design that is evaluated during a negative clock cycle is transformed to a multiplexer and a flop, and each flop that is evaluated during both positive and negative cycles is transformed to a flop and a pair of multiplexers. The clock terminals of all flops in a transformed design are clocked by the positive edges of the driver clock pck2, in accordance with embodiment of the present disclosure. To keep the number of transformation as few as possible, in accordance with another aspect of the present disclosure, clocks that are derived from a design clock may be shifted in time so that they occur only during the positive edges of the design clock, as described further below.

Figure 7A:
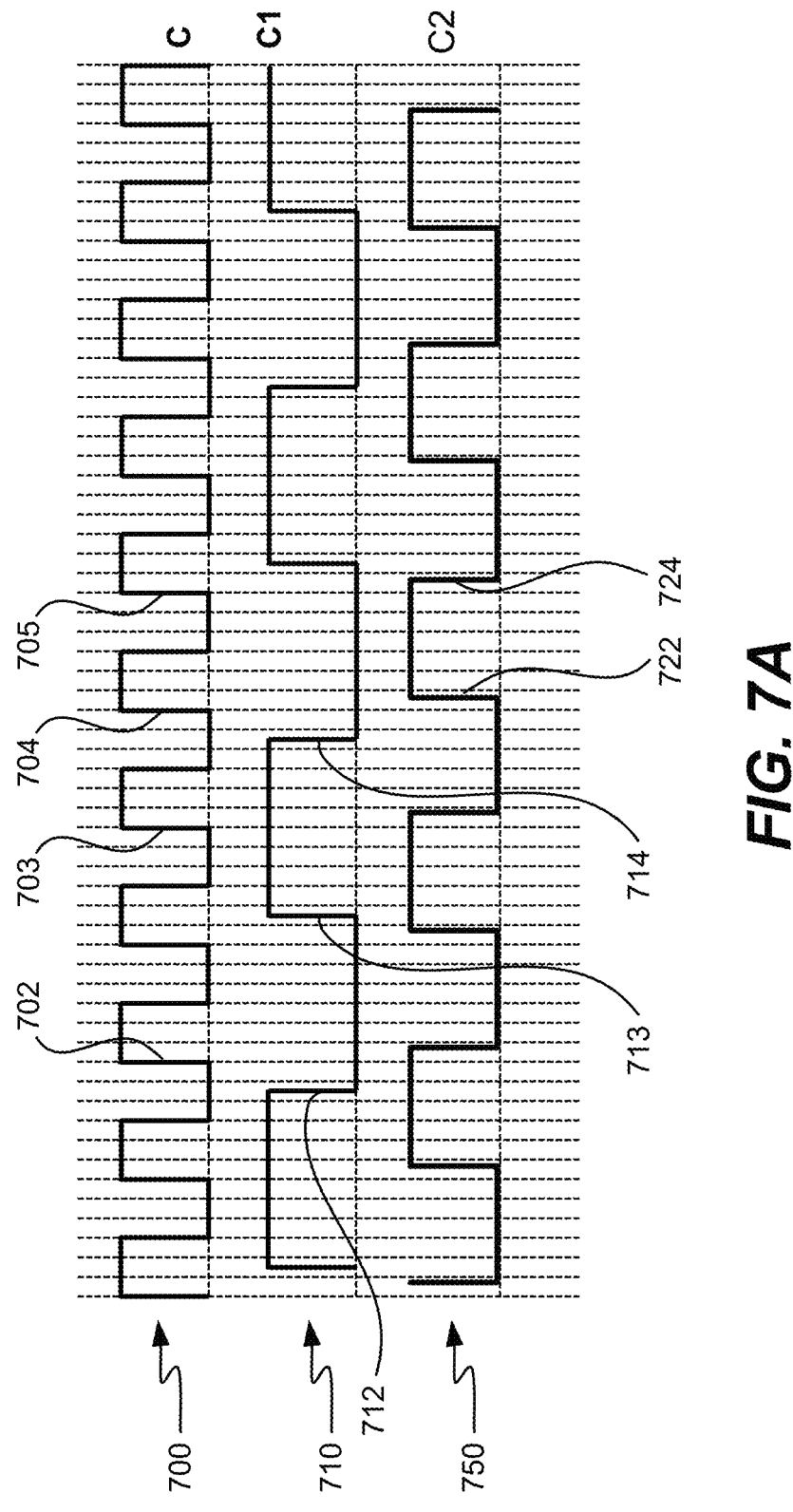
FIG. 7A shows a design clock waveform and a pair of clock waveforms that are derived from the design clock, in accordance with embodiment of the present disclosure.

FIG. 7A shows waveform 700 associated with a design clock C, and waveforms 710 and 750 associated with a pair of clocks C1 and C2 that are derived from design clock C. As seen from FIG. 6, clock C1 is shown as being three times slower than clock C, and clock C2 is shown as being two times slower than clock C. If the relationship between the periods/frequencies of clocks C and C1 does not change, and if the relationship between the periods/frequencies of clocks C and C2 does not change, then the relationship between the periods/frequencies of clocks C1 and C2 will not change either.

Because clock C is at least two times faster than clock C1, between two consecutive changes of clock C1, there is at least one positive edge of clock C. For example, there is at least one positive edge 703 of clock C between consecutive edges 713 and 714 of clock C1. Similarly, because clock C is at least two times faster than clock C2, between two consecutive changes of clock C2, there is at least one positive edge of clock C. For example, there is at least one positive edge 705 of clock C between consecutive edges 722 and 724 of clock C2.

Figure 7B:
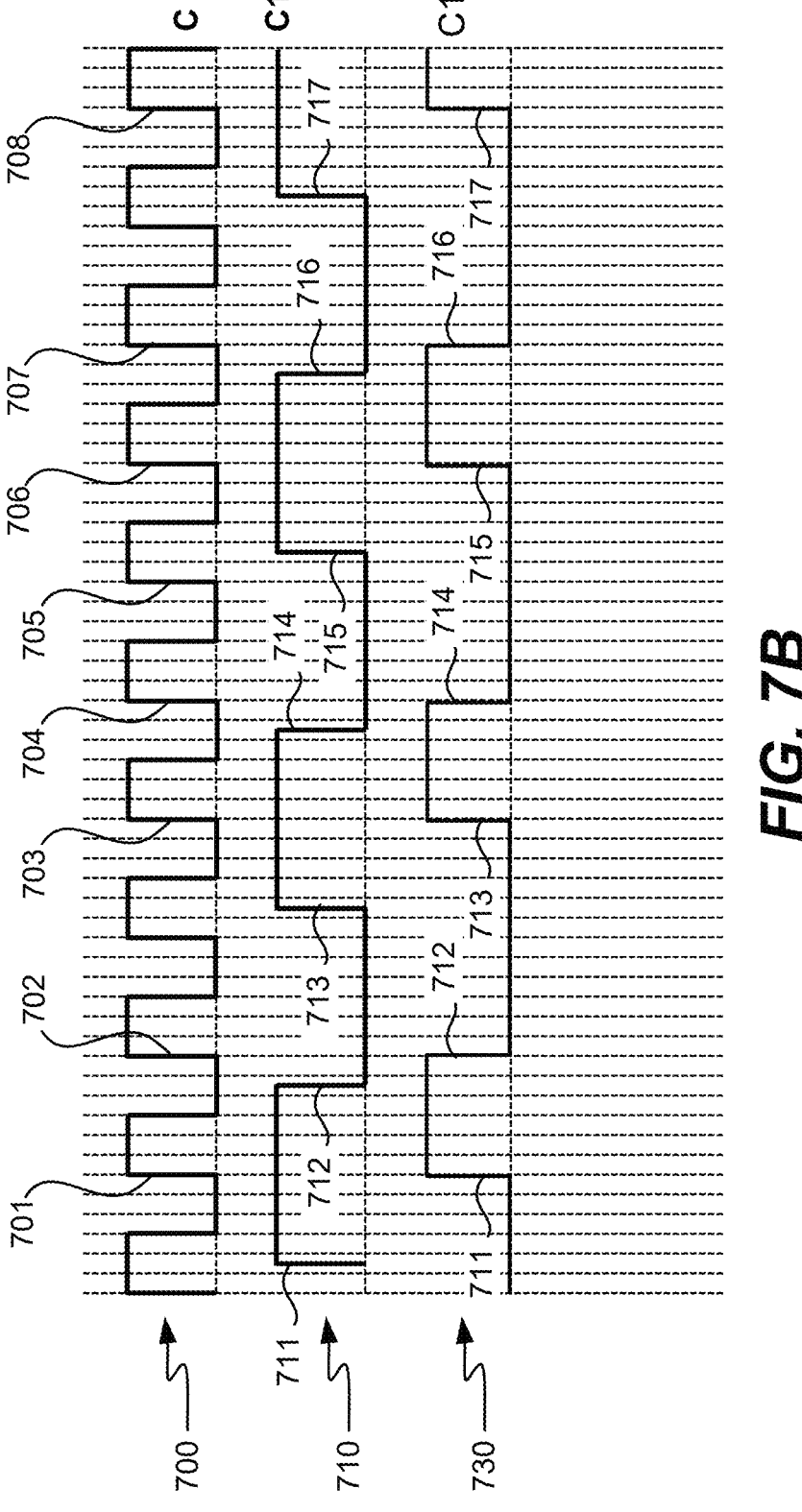
FIG. 7B shows the design clock waveform of FIG. 7A, as well as one of the derived clock waveforms before and after the derived clock waveform is shifted, in accordance with one embodiment of the present disclosure.

Given the fixed relationship between the clocks as described above, clock C1 may be shifted such that every rising and falling edge of clock C1 occurs at substantially the same time as the nearest upcoming rising edge of clock C. FIG. 7B shows waveforms 700 and 710 of clocks C and C1 that are also shown in FIG. 7A, as well as waveform 730 of clock C1 after clock C1 is shifted, in accordance with embodiments of the present disclosure, so that every rising and falling edge of clock C1 occurs at substantially the same time as the nearest upcoming rising edge of clock C. For example, rising edge 711 of waveform 710 of clock C1 is shifted in waveform 730 so as to occur at substantially the same time as the nearest upcoming rising edge 701 of clock C; falling edge 712 of waveform 710 of clock C1 is shifted in waveform 730 so as to occur at substantially the same time as the nearest upcoming rising edge 702 of clock C; rising edge 713 of waveform 710 of clock C1 is shifted in waveform 730 so as to occur at substantially the same time as the nearest upcoming rising edge 703 of clock C; and falling edge 714 of waveform 710 of clock C1 is shifted in waveform 730 so as to occur at substantially the same time as the nearest upcoming rising edge 704 of clock C. By realigning the timing of the edges of a derived clock as described above, the clock is ensured not to transition in negative cycles, therefore dispensing with the need to transform the flop receiving the derived clock.

Figure 7C:
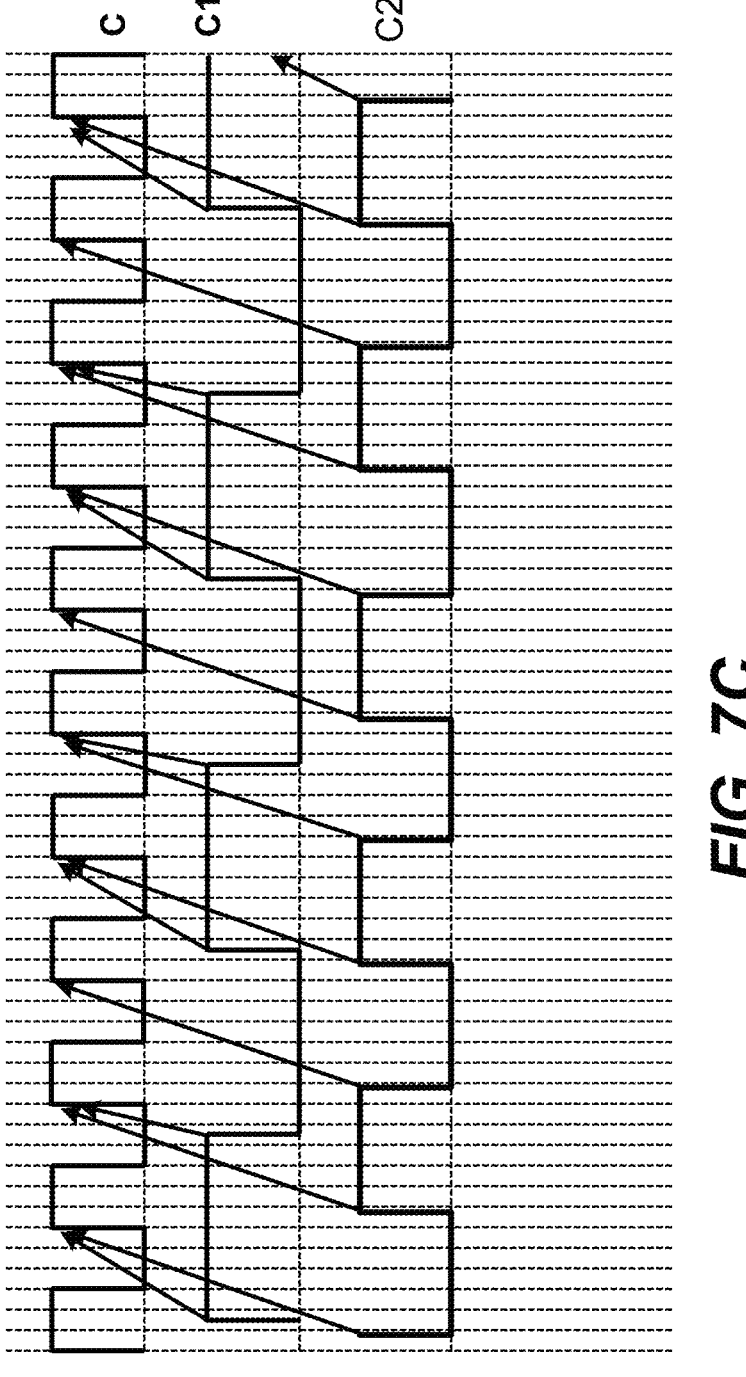
FIG. 7C shows, in part, the rising edges of the design clock waveform of FIG. 7A with respect to which the rising and falling edges of the derived clock waveforms of FIG. 7A are aligned, in accordance with embodiment of the present disclosure.

FIG. 7C shows waveforms 700, 710 and 750 associated with clocks C, C1 and C2, as is also shown in FIG. 7A, except that FIG. 7C also shows (i) an arrow pointing from each rising edge of clock C1 to a nearest upcoming rising edge of clock C to which the rising edge of clock C1 is to be aligned, (i) an arrow pointing from each falling edge of clock C1 to a nearest upcoming rising edge of clock C to which the falling edge of clock C1 is to be aligned, (iii) an arrow pointing from each rising edge of clock C2 to a nearest upcoming rising edge of clock C to which the rising edge of clock C2 is to be aligned, and (iii) an arrow pointing from each falling edge of clock C2 to a nearest upcoming rising edge of clock C to which the falling edge of clock C2 is to be aligned, as described with respect to FIG. 7B. Following the clock realignment as described above with reference to FIGS. 7A, 7B, and 7C, any clock that is generated by combining clocks C1 and C1 cannot change during negative cycles. Accordingly, any flop driven by a clock generated by combining clocks C1 and C1 is a positive flop.

Figure 8:
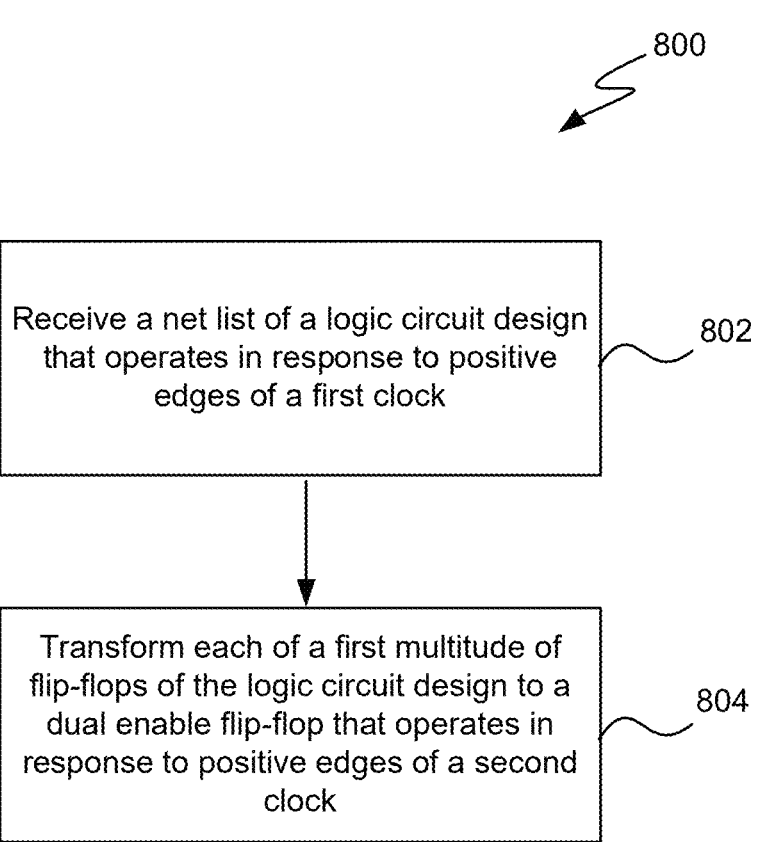
FIG. 8 is a flowchart for transforming a logic circuit design in preparation to perform hardware emulation on the transformed logic circuit design, in accordance with one embodiment of the present disclosure.

FIG. 8 is a flowchart 800 for transforming a logic circuit design in preparation to perform hardware emulation on the transformed logic circuit design, in accordance with one embodiment of the present disclosure. At 802, a netlist of the logic circuit design is received. The logic circuit design is configured to operate in response to positive edges of a first clock signal. At 804, each of a first multitude of the flip-flops disposed in the logic circuit design is transformed to a dual-enable flip-flop that operates in response to positive edges of a second clock signal, thereby to generate a transformed logic circuit design. A hardware emulation is subsequently performed on the transformed logic circuit design, A positive enable signal, a positive data input signal, and a positive data output signal of each dual-enable flip-flop respectively have similar values as an enable signal, data input signal and data output signal of the corresponding flip-flop during even cycles of the first clock. A negative enable signal, a negative data input signal, and a negative data output signal of each dual-enable flip-flop respectively have similar values as the enable signal, the data input signal and the data output signal of the corresponding flip-flop during odd cycles of the first clock. The state of the logic circuit design after 2k cycles of the first clock is the same as a state of the transformed logic circuit design after k cycles of the second clock.

Figure 9:
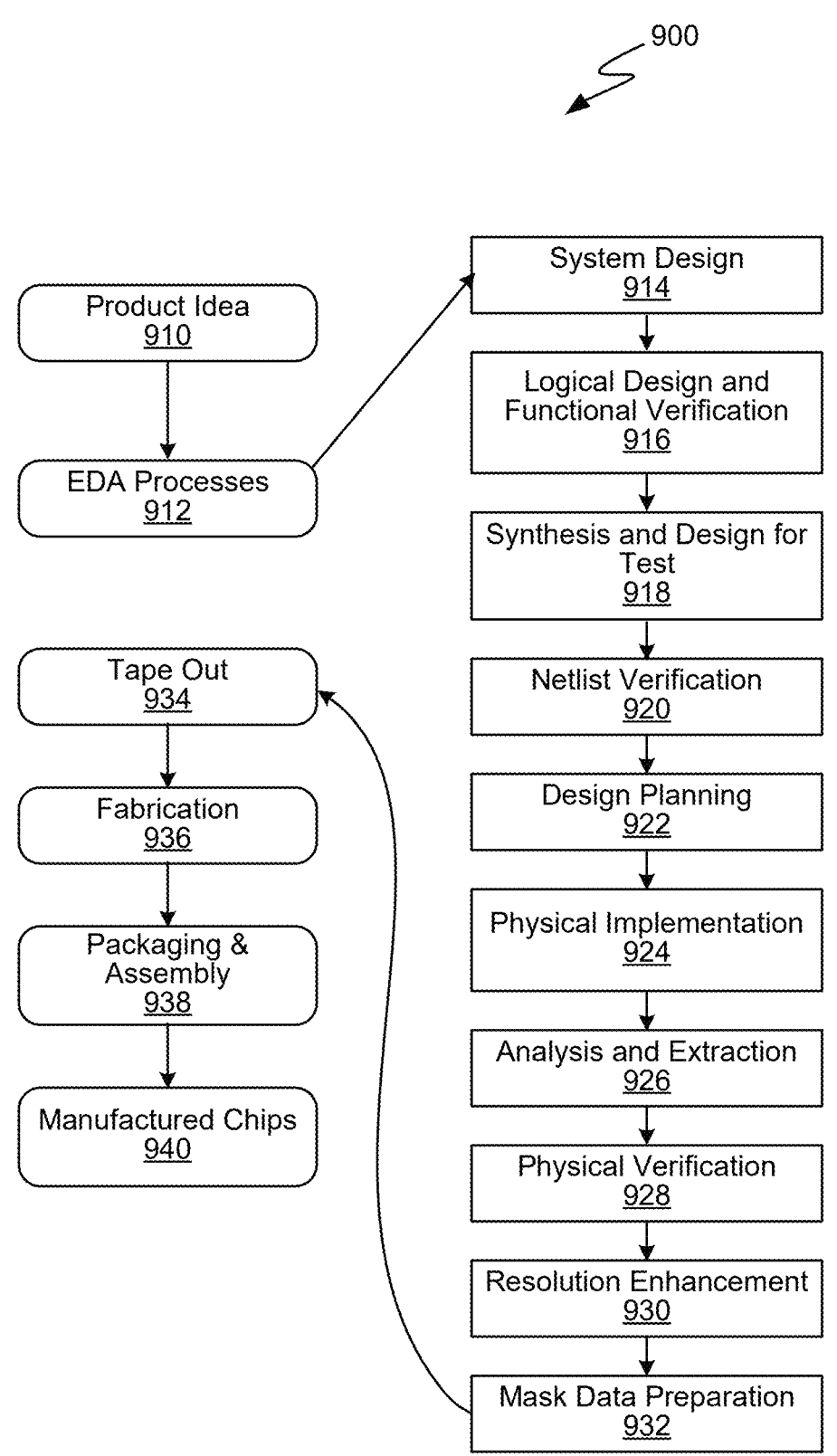
FIG. 9 depicts a flowchart of various processes used during the design and manufacture of an integrated circuit in accordance with some embodiments of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 936 are performed to produce the finished integrated circuit 940.

Specifications for a circuit or electronic structure may range from low-level transistor material layouts to high-level description languages. A high-level description may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 9. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1100 of FIG. 11) may be used to store the programs and data structures that are used by some or all of the EDA products described herein, and products used for development of cells for the library and for physical and logical design that use the library.

Figure 10:
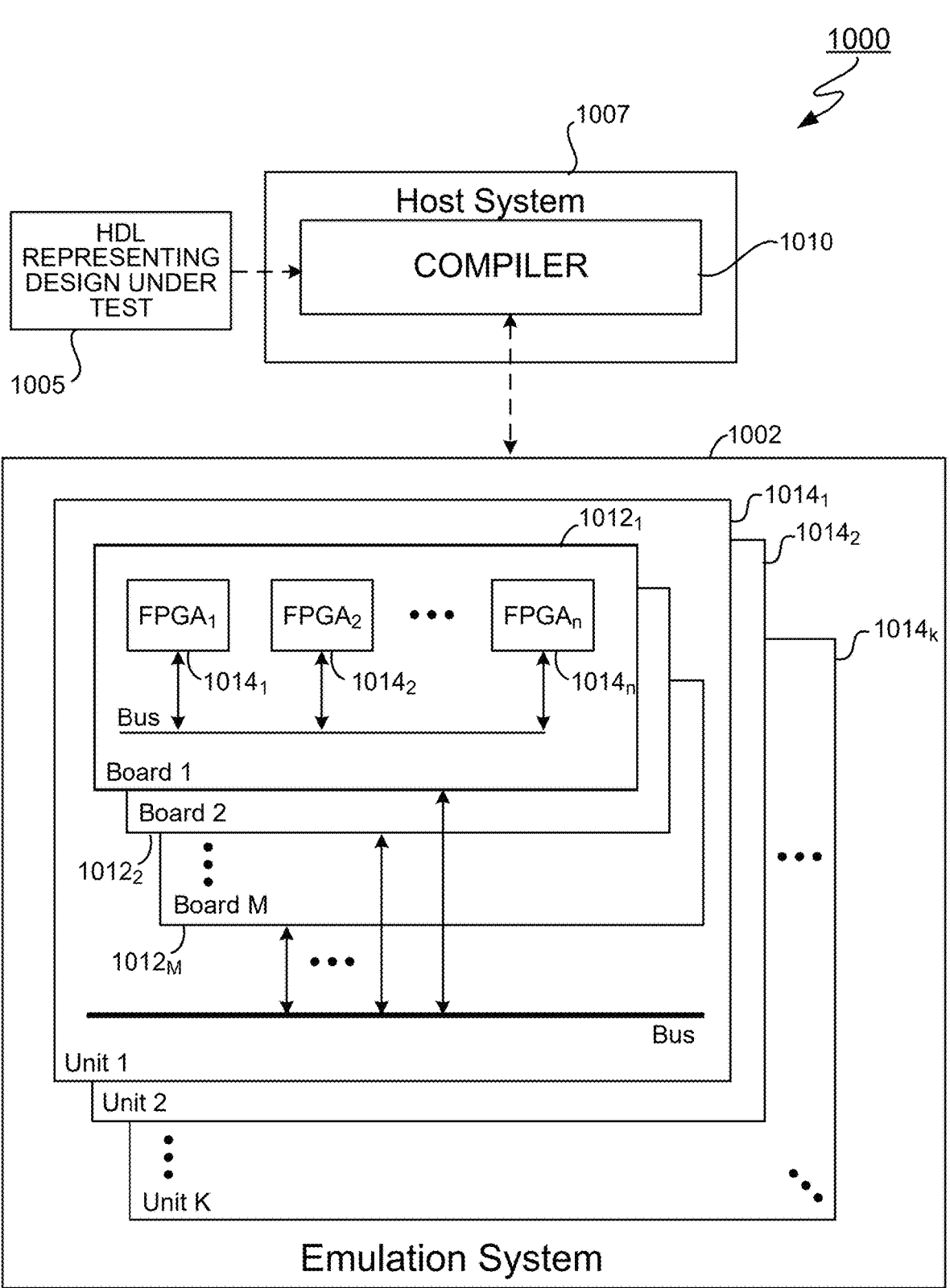
FIG. 10 depicts a diagram of an example emulation system in accordance with some embodiments of the present disclosure.

FIG. 10 depicts a diagram of an example emulation environment 1000. An emulation environment 1000 may be configured to verify the functionality of the circuit design. The emulation environment 1000 may include a host system 1007 (e.g., a computer that is part of an EDA system) and an emulation system 1002 (e.g., a set of programmable devices such as Field Programmable Gate Arrays (FPGAs) or processors). The host system generates data and information by using a compiler 1010 that transforms each of a multitude of flip-flop to a dual-enable flip-flop, as described above, to structure the emulation system to emulate a circuit design. A circuit design to be emulated is also referred to as a Design Under Test ('DUT') where data and information from the emulation are used to verify the functionality of the DUT.

The host system 1007 may include one or more processors. In the embodiment where the host system includes multiple processors, the functions described herein as being performed by the host system can be distributed among the multiple processors. The host system 1007 may include a compiler 1010 to transform specifications written in a description language that represents a DUT and to produce data (e.g., binary data) and information that is used to structure the emulation system 1002 to emulate the DUT. The compiler 1010 can transform, change, restructure, add new functions to, and/or control the timing of the DUT.

The host system 1007 and emulation system 1002 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 1207 and emulation system 1002 can exchange data and information through a third device such as a network server.

The emulation system 1202 includes multiple FPGAs (or other modules) such as FPGAs $1004_1$ and $1004_2$ as well as additional FPGAs to $1004_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 1002 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $1004_1$-$1004_N$ may be placed onto one or more boards $1012_1$ and $1012_2$ as well as additional boards through $1012_M$. Multiple boards can be placed into an emulation unit $1014_1$. The boards within an emulation unit can be connected using the backplane of the emulation unit or any other types of connections. In addition, multiple emulation units (e.g., $1014_1$ and $1014_2$ through $1014_K$) can be connected to each other by cables or any other means to form a multi-emulation unit system.

For a DUT that is to be emulated, the host system 1007 transmits one or more bit files to the emulation system 1002. The bit files may specify a description of the DUT and may further specify partitions of the DUT created by the host system 1007 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1007 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 1007 and/or the compiler 1010 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 1005 into gate level logic. For a DUT that is to be emulated, the design synthesizer sub-system receives a description of the DUT. If the description of the DUT is fully or partially in HDL (e.g., RTL or other levels of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

Figure 11:
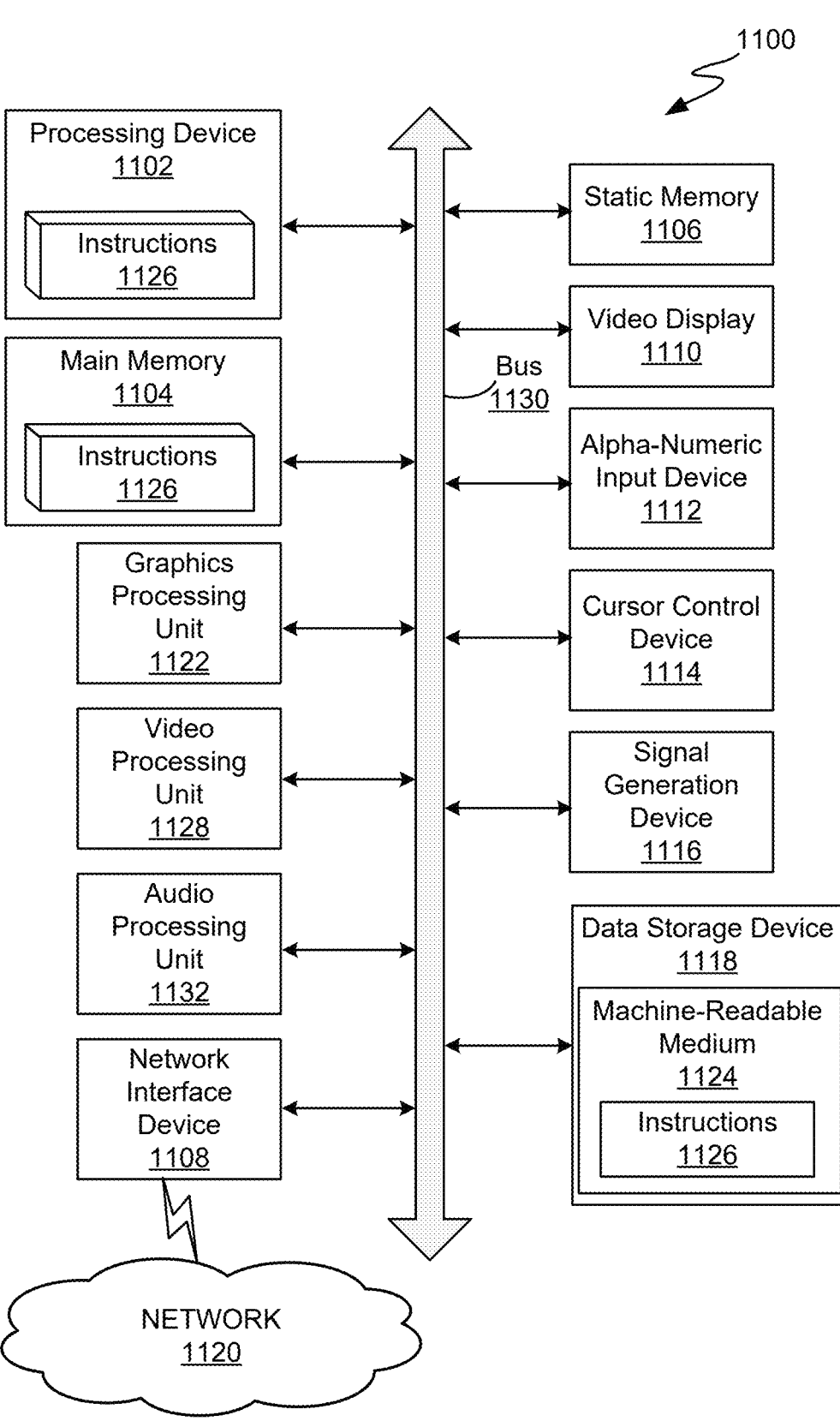
FIG. 11 depicts an example diagram of an example computer system in which embodiments of the present disclosure may operate.

FIG. 11 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

What is claimed:

1. A method of verifying a logic circuit design by a hardware emulation system, the method comprising:
   receiving a netlist of the logic circuit design configured to operate in response to positive edges of a first clock signal;
   transforming each of a first plurality of flip-flops disposed in the logic circuit design to a dual-enable flip-flop configured to operate in response to positive edges of a second clock signal thereby to generate a transformed logic circuit design,
   wherein a positive enable signal, a positive data input signal, and a positive data output signal of the dual-enable flip-flop respectively have similar values as an enable signal, data input signal and data output signal of the flip-flop during even cycles of the first clock,
   wherein a negative enable signal, a negative data input signal, and a negative data output signal of the dual-enable flip-flop respectively have similar values as the enable signal, the data input signal and the data output signal of the flip-flop during odd cycles of the first clock, and
   wherein a state of the logic circuit design after 2k cycles of the first clock is a same as a state of the transformed logic circuit design after k cycles of the second clock, wherein k is a positive integer.

2. The method of claim 1 further comprising:
   performing emulation of the transformed logic circuit design.

3. The method of claim 1 further comprising:

generating a design clock signal from the first clock signal, wherein edges of the design clock signal change in response to positive edges of the first clock signal, and wherein the design clock is a fastest clock used in the logic circuit design.

4. The method of claim 3 further comprising:

transforming each of a second plurality of flip-flips in the logic circuit design that is responsive to negative edges of the design clock into a first flip-flop and a first multiplexer, wherein the first flip-flop receives positive edges of the first clock and includes an enable terminal that is coupled to a select terminal of the first multiplexer, wherein a data input terminal of the first flip-flip is coupled to a first input terminal of the first multiplexer, and wherein a data output terminal of the first flip-flop is coupled to a second input terminal of the first multiplexer.

5. The method of claim 1 wherein each dual-enable flip-flop comprises a flip-flop, a first multiplexer and a second multiplexer, wherein a negative data input signal of the dual-enable flip-flop is applied to a first input terminal of the first multiplexer, a negative enable terminal of the dual-enable flip-flop is applied to a select terminal of the first multiplexer, and an output of the first multiplexer is applied to a data input terminal of the flip-flop, a positive data input signal of the dual-enable flip-flop is applied to a first input terminal of the second multiplexer, and a positive enable terminal of the dual-enable flip-flop is applied to a select terminal of the second multiplexer, an output of the second multiplexer supplies the positive output signal of the dual-enable flip-flop, and an output of the flip-flop supplies the negative output signal of the dual-enable flip-flop.

6. The method of claim 1 wherein a positive data output signal of a first one of the plurality of dual-enable flip-flops is received as a negative data signal by a second one of the plurality of dual-enable flip-flops, and a negative data output signal of the first one of the plurality of dual-enable flip-flops is received as a positive data signal by the second one of the plurality of dual-enable flip-flops.

7. The method of claim 6 wherein a positive data output signal of a third one of the plurality of dual-enable flip-flops is received as positive enable signals of the first and second ones of the plurality of dual flip-flops, and a negative data output signal of the third one of the plurality of dual-enable flip-flops is received as negative enable signals of the first and second ones of the plurality of dual flip-flops.

8. The method of claim 2 further comprising:

pausing the emulation in response to a request to make a function call triggered by the design clock;

computing a first function, responsive to a positive edge of the design clock, by a computer system that is in communication with the hardware emulation system;

computing a second function, responsive to a negative edge of the design clock, by the computer system while the emulation remains paused; and resuming the emulation after results of the first and second functions are computed and returned to the hardware emulation system.

9. The method of claim 1 further comprising:

replicating a first combinatorial gate disposed between an output of a first one of the plurality of dual-enable flip-flops and inputs of a second one of the plurality of dual-enable flip-flops and a third one of the plurality of dual-enable flip-flops if the first one of the plurality of dual-enable flip-flops has a non-zero negative enable signal, the second one of the plurality of dual-enable flip-flops has a non-zero negative enable signal during negative cycles of the design clock, and the third one of the plurality of dual-enable flip-flops has a non-zero positive enable signal during positive cycles of the design clock.

10. The method of claim 3 further comprising:

identifying, from among a plurality of clock signals derived from the design clock, at least a first clock signal having a frequency that is smaller than a frequency of the design clock; and shifting times of changes of the first clock such that each time shifted change occurs at substantially a same time as a nearest upcoming rising of edge of the design clock.

11. A hardware emulation system comprising:

a memory storing instructions; and a processor, coupled with the memory and configured to execute the instructions, the instructions when executed causing the processor to:

receive a netlist of the logic circuit design configured to operate in response to positive edges of a first clock signal; and transform each of a first plurality of flip-flops disposed in the logic circuit design to a dual-enable flip-flop configured to operate in response to positive edges of a second clock signal thereby to generate a transformed logic circuit design, wherein a positive enable signal, a positive data input signal, and a positive data output signal of the dual-enable flip-flop respectively have similar values as an enable signal, data input signal and data output signal of the flip-flop during even cycles of the first clock, wherein a negative enable signal, a negative data input signal, and a negative data output signal of the dual-enable flip-flop respectively have similar values as the enable signal, the data input signal and the data output signal of the flip-flop during odd cycles of the first clock, and wherein a state of the logic circuit design after 2k cycles of the first clock is a same as a state of the transformed logic circuit design after k cycles of the second clock, wherein k is a positive integer.

12. The hardware emulation system of claim 11 wherein the instructions further cause the processor to:

perform emulation of the transformed logic circuit design.

13. The hardware emulation system of claim 11, wherein the instructions further cause the processor to:

generate a design clock signal from the first clock signal, wherein edges of the design clock signal change in response to positive edges of the first clock signal, and wherein the design clock is a fastest clock used in the logic circuit design.

14. The hardware emulation system of claim 13, wherein the instructions further cause the processor to:

transform each of a second plurality of flip-flip in the logic circuit design that is responsive to negative edges of the design clock into a first flip-flop and a first multiplexer, wherein the first flip-flop receives positive edges of the first clock and includes an enable terminal that is coupled to a select terminal of the first multiplexer, wherein a data input terminal of the first flip-flip is coupled to a first input terminal of the first multiplexer, and wherein a data output terminal of the first flip-flop is coupled to a second input terminal of the first multiplexer.

15. The hardware emulation system of claim 11, wherein each dual-enable flip-flop comprises a flip-flop, a first multiplexer and a second multiplexer, wherein a negative data input signal of the dual-enable flip-flop is applied to a first input terminal of the first multiplexer, a negative enable terminal of the dual-enable flip-flop is applied to a select terminal of the first multiplexer, and an output of the first multiplexer is applied to a data input terminal of the flip-flop, a positive data input signal of the dual-enable flip-flop is applied to a first input terminal of the second multiplexer, and a positive enable terminal of the dual-enable flip-flop is applied to a select terminal of the second multiplexer, an output of the second multiplexer supplies the positive output signal of the dual-enable flip-flop, and an output of the flip-flop supplies the negative output signal of the dual-enable flip-flop.

16. The hardware emulation system of claim 11, wherein a positive data output signal of a first one of the plurality of dual-enable flip-flops is received as a negative data signal by a second one of the plurality of dual-enable flip-flops, and a negative data output signal of the first one of the plurality of dual-enable flip-flops is received as a positive data signal by the second one of the plurality of dual-enable flip-flops.

17. The hardware emulation system of claim 12 wherein the instructions further cause the processor to:

pause the emulation in response to a request to make a function call triggered by the design clock;

compute a first function, responsive to a positive edge of the design clock, by a computer system that is in communications with the hardware emulation system;

compute a second function, responsive to a negative edge of the design clock, by the computer system while the emulation remains paused; and resume the emulation after results of the first and second functions are computed and returned to the hardware emulation system.

18. The hardware emulation system of claim 11 wherein the instructions further cause the processor to:

replicate a first combinatorial gate disposed between an output of a first one of the plurality of dual-enable flip-flops and inputs of a second one of the plurality of dual-enable flip-flops and a third one of the plurality of dual-enable flip-flops if the first one of the plurality of dual-enable flip-flops has a non-zero negative enable signal, the second one of the plurality of dual-enable flip-flops has a non-zero negative enable signal during negative cycles of the design clock, and the third one of the plurality of dual-enable flip-flops has a non-zero positive enable signal during positive cycles of the design clock.

19. The hardware emulation system of claim 13 wherein the instructions further cause the processor to:

identify, from among a plurality of clock signals derived from the design clock, at least a first clock signal having a frequency that is at least twice smaller than a frequency of the design clock; and shift times of changes of the first clock such that each time shifted change occurs at substantially a same time as a nearest upcoming rising of edge of the design clock.

20. A non-transitory computer readable medium comprising stored instructions, which when executed by a processor, cause the processor to:

receive a netlist of the logic circuit design configured to operate in response to positive edges of a first clock signal; and transform each of a first plurality of flip-flops disposed in the logic circuit design to a dual-enable flip-flop configured to operate in response to positive edges of a second clock signal thereby to generate a transformed logic circuit design, wherein a positive enable signal, a positive data input signal, and a positive data output signal of the dual-enable flip-flop respectively have similar values as an enable signal, data input signal and data output signal of the flip-flop during even cycles of the first clock, wherein a negative enable signal, a negative data input signal, and a negative data output signal of the dual-enable flip-flop respectively have similar values as the enable signal, the data input signal and the data output signal of the flip-flop during odd cycles of the first clock, and wherein a state of the logic circuit design after 2k cycles of the first clock is a same as a state of the transformed logic circuit design after k cycles of the second clock, wherein k is a positive integer.

* * * * *